(12) United States Patent  
Takahashi et al.

(10) Patent No.: US 6,995,800 B2  
(45) Date of Patent: Feb. 7, 2006

(54) IMAGE PICKUP APPARATUS UTILIZING A PLURALITY OF CONVERGING LENSES

(75) Inventors: Hidekazu Takahashi, Isehara (JP); Tetsunobu Kochi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 827 days.

(21) Appl. No.: 09/768,500

(22) Filed: Jan. 25, 2001

(65) Prior Publication Data

US 2001/0026322 A1    Oct. 4, 2001

(30) Foreign Application Priority Data

Jan. 27, 2000  (JP)  .............................. 2000-019227  
Nov. 30, 2000  (JP)  .............................. 2000-365551

(51) Int. Cl.  
    *H04N 5/225*   (2006.01)
(52) U.S. Cl. ...................... 348/340; 348/273; 257/294; 257/432
(58) Field of Classification Search ................ 257/294, 257/98, 432, 435, 440; 348/440, 335, 273, 348/274, 275, 340, 294; 438/69  
See application file for complete search history.

(56) References Cited

U.S. PATENT DOCUMENTS

| | | | | |
|---|---|---|---|---|
| 5,610,390 A | * | 3/1997 | Miyano ...................... 250/216 |
| 5,631,705 A | | 5/1997 | Tani ............................ 348/314 |
| 5,682,203 A | * | 10/1997 | Kato ........................... 348/340 |
| 5,698,844 A | | 12/1997 | Shinohara et al. ...... 250/214 R |
| 5,786,588 A | | 7/1998 | Takahashi ................ 250/208.1 |
| 5,955,753 A | | 9/1999 | Takahashi ................... 257/292 |
| 5,986,704 A | * | 11/1999 | Asai et al. .................. 348/340 |
| 6,008,511 A | * | 12/1999 | Tokumitsu et al. ......... 257/232 |
| 6,069,350 A | * | 5/2000 | Ohtsuka et al. .......... 250/208.1 |
| 6,093,081 A | * | 7/2000 | Nyui et al. ..................... 451/6 |
| 6,137,535 A | * | 10/2000 | Meyers ....................... 348/340 |
| 6,147,338 A | | 11/2000 | Takahashi ................ 250/208.1 |
| 6,201,574 B1 | * | 3/2001 | Martin ........................ 348/315 |
| 6,278,169 B1 | * | 8/2001 | Sayuk et al. ................ 257/435 |
| 6,339,506 B1 | * | 1/2002 | Wakelin et al. ............. 359/648 |
| 6,344,666 B1 | * | 2/2002 | Yamaguchi et al. .......... 257/98 |
| 6,518,639 B2 | * | 2/2003 | Ueno et al. ................. 257/432 |
| 6,704,051 B1 | * | 3/2004 | Takahashi ................... 348/315 |

FOREIGN PATENT DOCUMENTS

| | | |
|---|---|---|
| JP | 5-40201 | 2/1993 |
| JP | A-06-062322 | 3/1994 |
| JP | A-06-140612 | 5/1994 |
| JP | A-07-240877 | 9/1995 |
| JP | A-08-107194 | 4/1996 |
| JP | A-08-116041 | 5/1996 |
| JP | A-2001-237404 | 8/2001 |
| JP | A-06-140609 | 5/2004 |

\* cited by examiner

*Primary Examiner*—Thai Tran  
*Assistant Examiner*—Justin Misleh  
(74) *Attorney, Agent, or Firm*—Fitzpatrick, Cella, Harper & Scinto

(57) ABSTRACT

In order to prevent an image quality from being lowered by shading and or the like, an image pickup apparatus is provided which includes an image pickup area including a plurality of photoelectric conversion areas, a plurality of converging lenses for converging light on a plurality of photoelectric conversion areas, and a light shielding area having a plurality of opening areas through which light is incident upon the plurality of photoelectric conversion areas, wherein positions of the converging lens and opening area are shifted inward than a corresponding photoelectric conversion area.

2 Claims, 19 Drawing Sheets

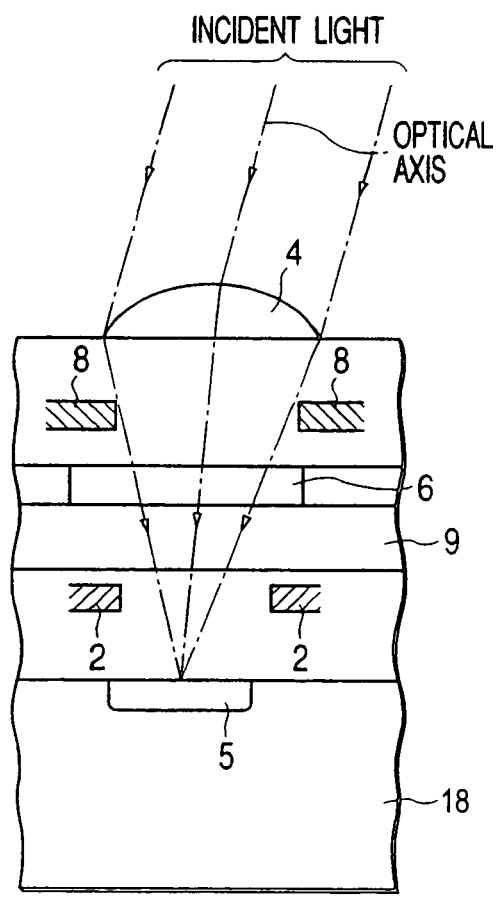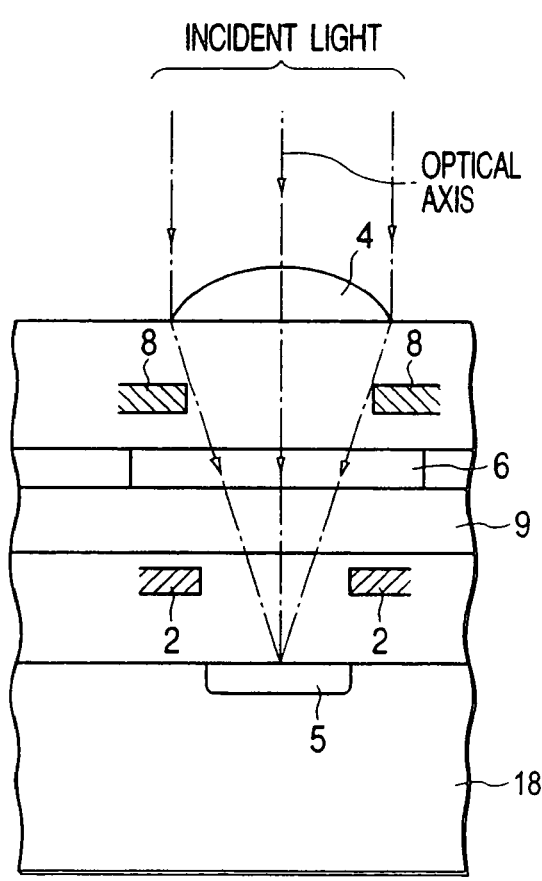

IMAGE PICKUP APPARATUS UTILIZING A PLURALITY OF CONVERGING LENSES

BACKGROUND OF THE INVENTION

1. Field of the Invention

The present invention relates to an image pickup apparatus with a plurality of pixels for converting converged light into electric signals.

2. Related Background Art

A conventional solid-state image pickup device has photoelectric conversion elements such as photodiodes for converting received light into electric signals and microlenses for converging light on photoelectric conversion elements, as described in, for example, Japanese Patent Application Laid-open No. 05-040201.

A microlens is provided for preventing the sensitivity of a photodiode from being lowered by the amount of light reduced because of a smaller size of a recent ultra fine pixel.

FIG. 1A is a plan view of a conventional solid-state image pickup device. FIG. 1B is a cross sectional view of each pixel of the solid-state image pickup device shown in FIG. 1A. In FIGS. 1A and 1B, reference numeral 1 represents a pixel having a photodiode 5 formed in the surface layer of a silicon substrate (Si substrate) 18. Reference numeral 2 represents a light shielding layer for shielding the area of the pixel 2 excepting the photodiode 5. Reference numeral 3 represents an opening area through which light is incident upon the photodiode 5. Reference numeral 4 represents a microlens for converging light on the photodiode 5. Reference numeral 6 represents a color filter layer of red, green, blue or the like.

As shown in FIG. 1A, the conventional solid-state image pickup device has a plurality of pixels disposed in a predetermined pattern. As shown in FIG. 1B, opening areas 3 and microlenses 4 are formed at the same pitch as that of light reception areas of the photodiodes 5 of pixels 1. The optical axis of light converged by the microlens 4 is coincident with the center of gravity of the opening area 3. Light passed through the microlens 4 is therefore converged on generally the center of the light reception area of the photodiode 5.

Since the position of the microlens 4 is set to the position corresponding to that of the photodiode 5 of each pixel 1, it is possible to prevent the sensitivity of the photodiode 5 from being lowered by the opening area 3 reduced by a smaller size of a ultra fine pixel 1, because light is converged by the microlens 4.

With the conventional techniques, however, a portion of light converged by the microlens may not reach the photodiode, depending upon the position of a pixel of the solid-state image pickup device. A variation of light reception sensitivities of solid-state image pickup devices may occur in some cases.

FIGS. 2A and 2B are diagrams illustrating the reason of such a variation. In FIGS. 2A and 2B, reference numeral 10 represents an object to be taken with a solid-state image pickup device, and reference numeral 11 represents an image pickup lens for focussing light from the object 10 upon the solid-state image pickup device. In FIGS. 2A and 2B, like elements to those shown in FIGS. 1A and 1B are represented by using identical reference numerals.

In FIGS. 2A and 2B, (ii) represents a pixel disposed near to the center of the solid-state image pickup device, and (i) and (iii) represent pixels disposed in the peripheral area of the solid-state image pickup device.

As shown in FIG. 2A, light from the object 10 passes through the image pickup lens 11 and is focussed upon the solid-state image pickup device. Light from the object 10 applied to the pixel (ii) in FIG. 2B passes through the microlens 4 and becomes incident upon the photodiode 5.

Alter light from the object 10 applied to the pixels (i) and (iii) shown in FIG. 2B passes through the microlens 4, a portion of the light is intercepted by the light shielding area of the light shielding layer 2 and does not enter the photodiode 5. It is therefore impossible to eliminate a variation in light reception sensitivities of photodiodes near to and away from the optical axis of the image pickup lens.

FIG. 3 is a graph showing output signals from the solid-state image pickup device shown in FIGS. 2A and 2B. As shown in FIG. 3, a difference between the maximum and minimum values of output signals is 10% or larger of an average value of the output signals of the conventional solid-state image pickup device.

Assuming that the average of output signals of a conventional solid-state image pickup device is 100 mV, the maximum output signal is 105 mV or higher and the minimum output signal is 95 mV or lower. Generally, if a difference between the maximum and minimum values of output signals of a solid-state image pickup device is 10% or smaller than that of the average value, it is considered that this difference will not adversely affect the quality of a reproduced image.

SUMMARY OF THE INVENTION

It is an object of the invention to provide a solid-state image pickup device having a small variation in reception light sensitivities and to an image pickup apparatus using such an element.

In order to achieve the above object, one aspect of the invention provides an image pickup apparatus comprising: an image pickup area including a plurality of photoelectric conversion areas; a plurality of converging lenses for converging light on a plurality of photoelectric conversion areas; and a light shielding area having a plurality of opening areas through which light is incident upon the plurality of photoelectric conversion areas, wherein the positions of the converging lens and opening area are shifted inward than a corresponding photoelectric conversion area.

Another aspect of the present invention provides an image pickup apparatus comprising: an image pickup area including a plurality of photoelectric conversion areas; and a plurality of converging lenses for converging light on a plurality of photoelectric conversion areas, the converging lenses being formed on a layer evened by a CMP process, wherein the positions of the converging lens are shifted inward than a corresponding photoelectric conversion area.

Another aspect of the present invention provides an image pickup apparatus comprising: an image pickup area including a plurality of photoelectric conversion areas; a plurality of converging lenses for converging light on a plurality of photoelectric conversion areas; a first light shielding area having a plurality of opening areas through which light is incident upon the plurality of photoelectric conversion areas; and a second light shielding area having a plurality of opening areas through which light is incident upon the plurality of photoelectric conversion areas, the second light shielding area being formed above the first light shielding area, wherein in the peripheral area of the image pickup area, the positions of the converging lens and the opening area of the second light shielding area are shifted inward than a corresponding photoelectric conversion area.

Another aspect of the present invention provides an image pickup apparatus comprising: an image pickup area including a plurality of photoelectric conversion areas; and a plurality of converging lenses for converging light on a plurality of photoelectric conversion areas, wherein the position of the converging lens is shifted inward than a corresponding photoelectric conversion area, and the plurality of photoelectric conversion areas in the image pickup area are disposed in a curved shape.

Another aspect of the present invention provides an image pickup apparatus comprising: an image pickup area including a plurality of photoelectric conversion areas; and a plurality of converging lenses for converging light on a plurality of photoelectric conversion areas, wherein in the peripheral area of the image pickup area, the position of the converging lens is shifted inward than a corresponding photoelectric conversion area, and a pitch between a plurality of converging lenses in a first area is different from a pitch between a plurality of converging lenses in a second area.

Another aspect of the present invention provides an image pickup apparatus comprising: a plurality of image pickup areas each including a plurality of photoelectric conversion areas; and a plurality of converging lenses for converging light on a plurality of photoelectric conversion areas, wherein in the peripheral area of the image pickup area, the position of the converging lens is shifted inward than a corresponding photoelectric conversion area, and in at least two image pickup areas, shift amounts between the converging lens and photoelectric conversion area are different.

Other objects and features of the present invention will become apparent from the following detailed description of embodiments when read in conjunction with the accompanying drawings.

BRIEF DESCRIPTION OF THE DRAWINGS

FIGS. 7A and 7B are a plan view and a cross sectional view of pixels of a solid-state image pickup device according to a third embodiment of the invention.

DETAILED DESCRIPTION OF THE PREFERRED EMBODIMENTS

Figure 1A:
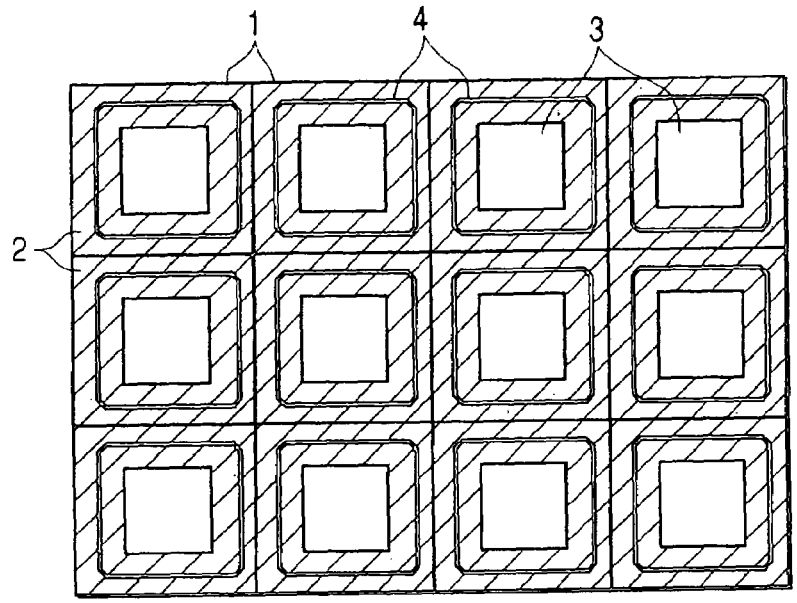
FIGS. 1A and 1B are a plan view of a conventional solid-state image pickup device and a cross sectional view of a pixel.
Figure 1B:
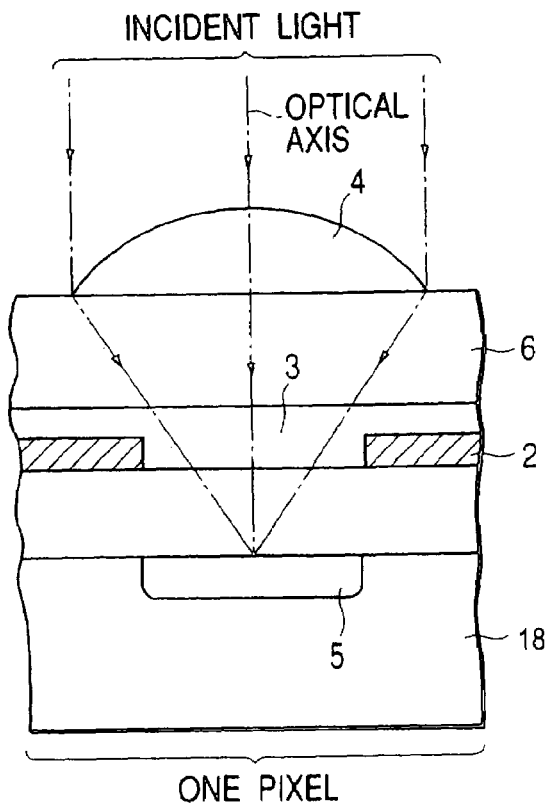
Figure 2A:
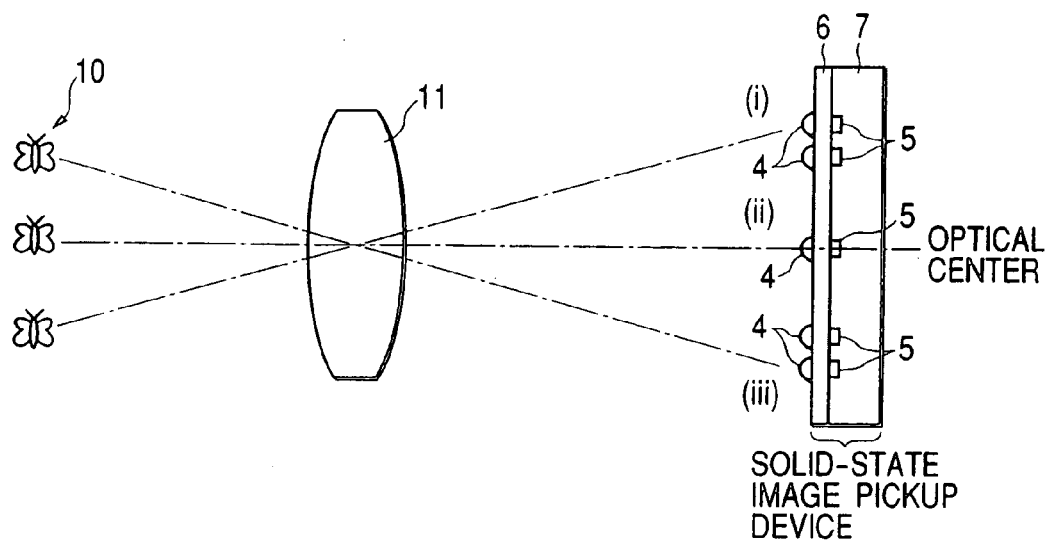
FIGS. 2A and 2B are diagrams explaining the reason of a variation in light reception sensitivities of a conventional solid-state image pickup device.
Figure 2B:
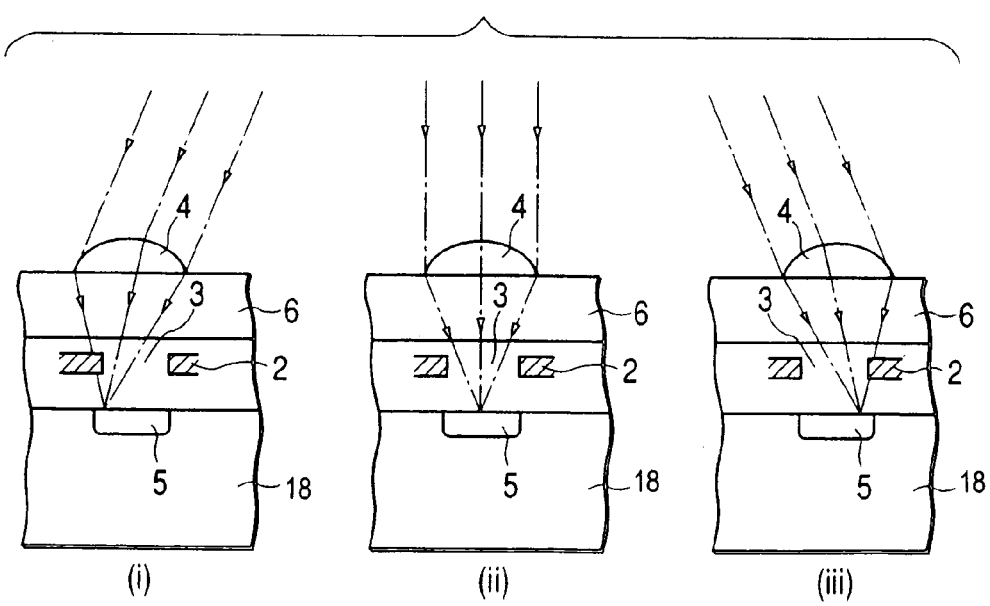
Figure 3:
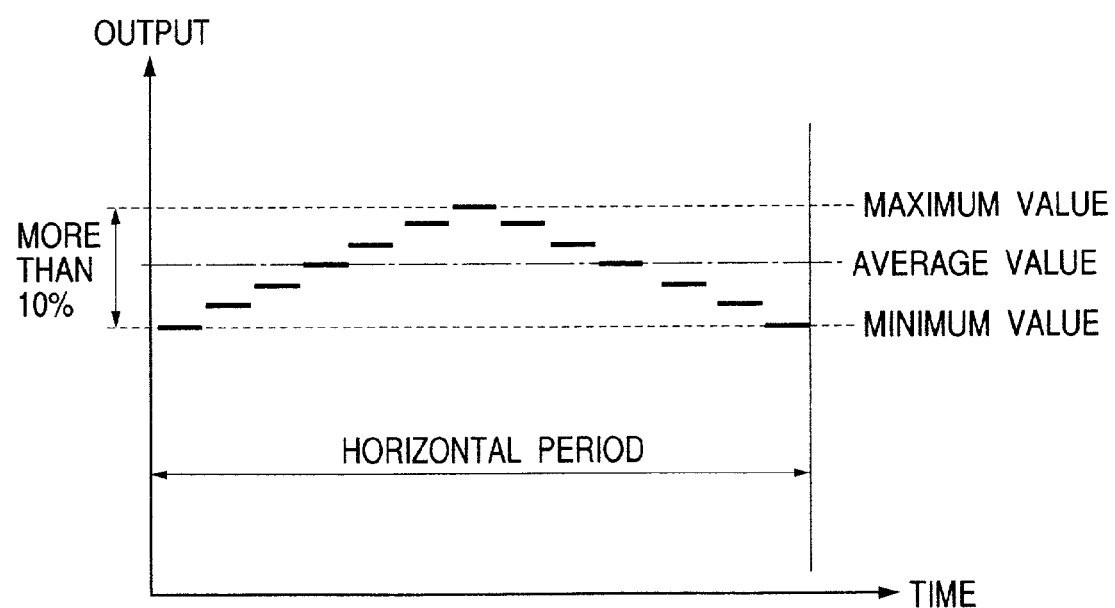
FIG. 3 is a graph showing output signals of the solid-state image pickup device shown in FIGS. 2A and 2B.
Figure 4A:
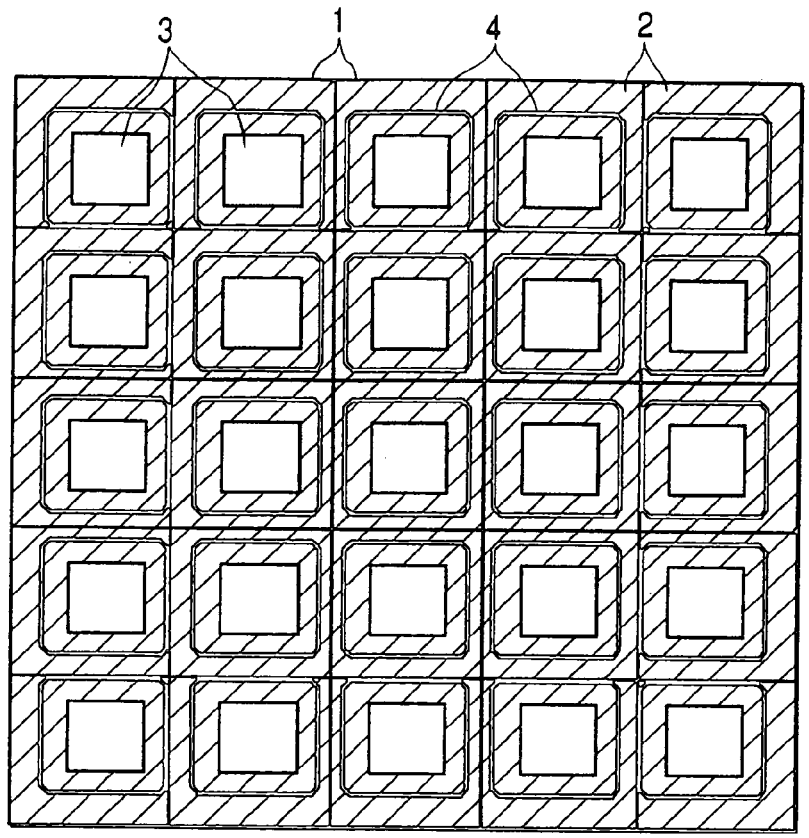
FIGS. 4A and 4B are a plan view and a cross sectional view of pixels of a solid-state image pickup device according to a first embodiment of the invention.
Figure 4B:
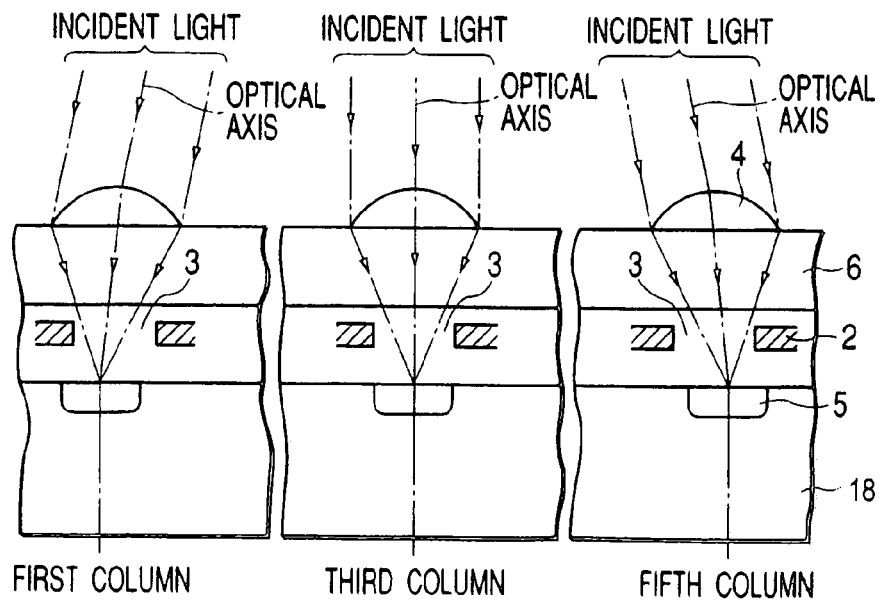

FIG. 4A is a plan view of a pixel group (image pickup area) of a solid-state image pickup device according to the first embodiment of the invention. FIG. 4B is a cross sectional view of pixels in the first, third and fifth columns of the pixel group shown in FIG. 4A. In FIGS. 4A and 4B, reference numeral 1 represents a pixel having a photodiode or photoelectric conversion element 5 formed in the surface layer of a silicon substrate (Si substrate) 18. Reference numeral 2 represents a light shielding layer having a light shielding area for shielding the area of the pixel 1 excepting the photodiode 5. Reference numeral 3 represents an opening area formed through the light shielding layer 2 through which light is incident upon the photodiode 5. Reference numeral 4 represents a microlens for converging light on the photodiode 5. Reference numeral 6 represents a color filter layer of red, green, blue or the like.

Although only 5×5 pixels are shown in FIG. 4A for the purposes of simplicity, several hundred thousands to several millions pixels are disposed two-dimensionally.

As shown in FIGS. 4A and 4B, in this embodiment, the pixel 1 disposed nearer to the peripheral area than the center of the pixel group has a center of gravity of the light reception area of the photodiode 5 positioned nearer to the peripheral area than the centers of gravity of the microlens 4 and opening area 3. Therefore, the optical axis of light converged by the microlens 4 becomes coincident with the center of gravity of the light reception area of the photodiode 5.

More specifically, the pixel 1 of the first column has the centers of gravity of the microlens 4 and opening area 3 positioned to the right as viewed in FIG. 4B relative to the center of gravity of the light reception area of the photodiode 5. The pixel 1 of the third column has the centers of gravity of the microlens 4 and opening area 3 positioned at the center of gravity of the light reception area of the photodiode 5. The pixel 1 of the fifth column has the centers of gravity of the microlens 4 and opening area 3 positioned to the left as viewed in FIG. 4B relative to the center of gravity of the light reception area of the photodiode 5. The center of gravity of the opening area 3 is the center of gravity of an optional mass disposed in the opening area 3.

As above, in this embodiment, the pixel 1 disposed nearer to the peripheral area than the center of the pixel group has a center of gravity of the photodiode 5 positioned nearer to the peripheral area than the centers of gravity of the microlens 4 and opening area 3. Therefore, light passing through the microlens 4 and being incident upon the photodiode 5 is not intercepted by the light shielding area of the light shielding layer 2.

Figure 5:
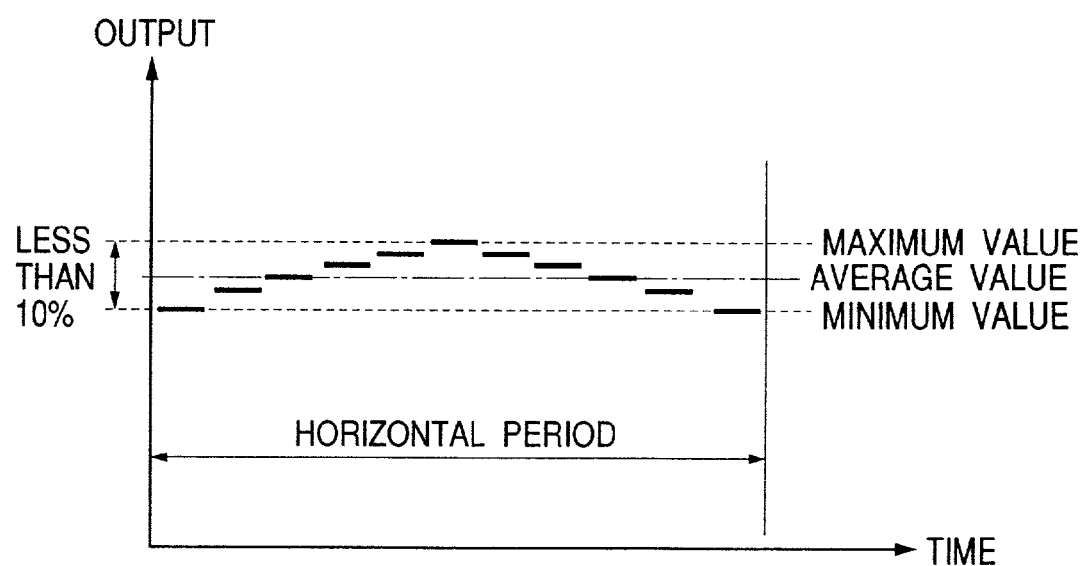
FIG. 5 is a graph showing output signals of the solid-state image pickup device shown in FIGS. 4A and 4B.

FIG. 5 is a diagram showing output signals of the solid-state image pickup device shown in FIGS. 4A and 4B. As shown in FIG. 5, a difference between the maximum and minimum values of output signals of the solid-state image pickup device of this embodiment is smaller than 10% of the average of output signals. This is because light converged on the photodiode 5 is not intercepted by the light shielding layer 2 and a variation in light reception sensitivities can be made small.

Figure 6A:
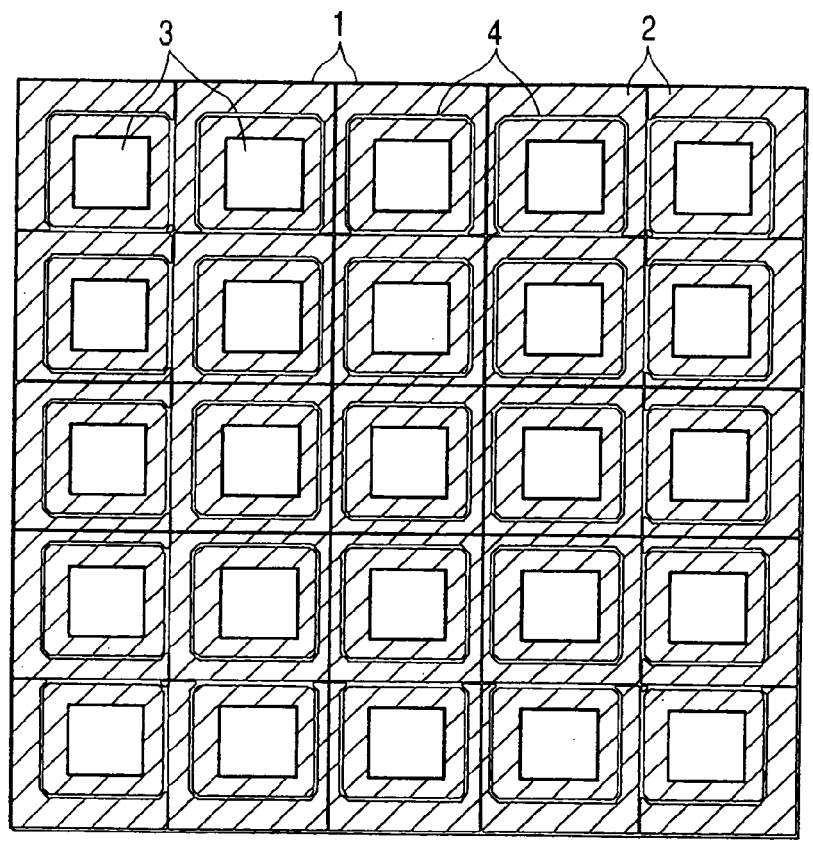
FIGS. 6A and 6B are a plan view and a cross sectional view of pixels of a solid-state image pickup device according to a second embodiment of the invention.
Figure 6B:
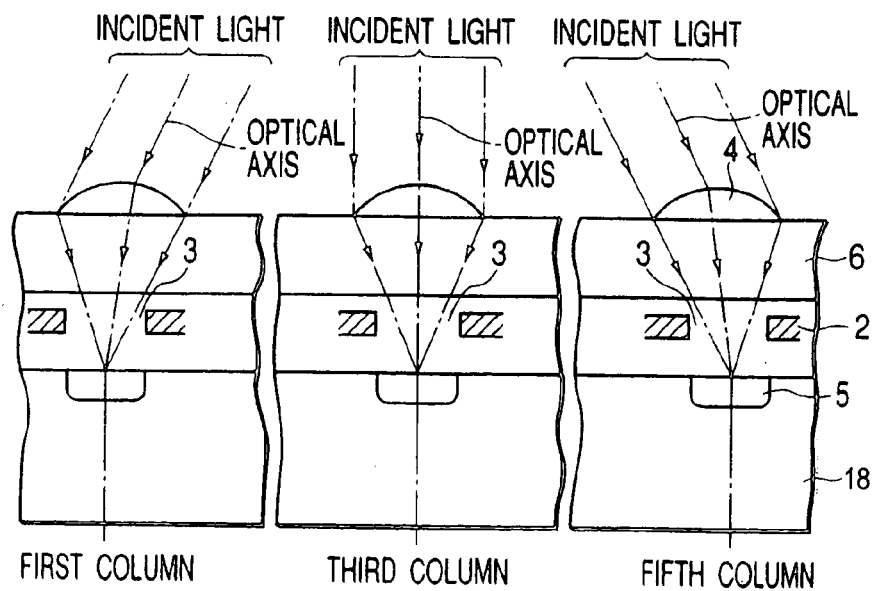

FIG. 6A is a plan view of a pixel group of a solid-state image pickup device according to the second embodiment of the invention. FIG. 6B is cross sectional views of pixels in the first, third and fifth columns of the pixel group shown in FIG. 6A. In FIGS. 6A and 6B, like elements to those shown in FIGS. 4A and 4B are represented by using identical reference numerals.

As shown in FIGS. 6A and 6B, in this embodiment, the pixel 1 disposed nearer to the peripheral area than the center of the pixel group has the center of gravity of the light reception area of the photodiode 5 positioned nearer to the peripheral area than the center of gravity of the microlens 4. In addition, the center of gravity of the opening area 3 is positioned nearer to the peripheral area than the center of gravity of the microlens 4. Therefore, the optical axis of light converged by the microlens 4 becomes coincident with the center of gravity of the light reception area of the photodiode and the center of gravity of the opening area 3.

The structure of the pixel 1 shown in FIGS. 6A and 6B can be used effectively, for example, if the color filter layer 6 has some thickness, i.e., if the distance between the light shielding layer 2 and microlens 4 is longer.

As above, the pixel 1 disposed nearer to the peripheral area than the center of the pixel group has the centers of gravity of the opening area 3 and light reception area of the photodiode 5 each of which shifted from the center of gravity of the microlens 4. It is therefore possible to reduce a variation in light reception sensitivities more than that of the solid-state image pickup device shown in FIGS. 4A and 4B.

FIGS. 7A and 7B are cross sectional views of pixels according to the third embodiment of the invention. The pixels correspond to the pixels in the first and third columns shown in FIG. 4B. In FIGS. 7A and 7B, reference numeral 8 represents a light shielding black filter layer made of organic material or the like, and reference numeral 9 represents a evening layer for evening a color filter layer 6.

The black filter layer 8 is provided in order to avoid adverse effects of light incident upon the area excepting the microlens 4, such as stray light and light crosstalk. The black filter layer 8 is formed by manufacture processes for the color filter layer 6. In FIGS. 7A and 7B, like elements to those shown in FIGS. 4A and 4B are represented by using identical reference numerals.

As shown in FIGS. 7A and 7B, in this embodiment, the pixel 1 disposed nearer to the peripheral area than the center of the pixel group has the centers of gravity of the light reception area of the photodiode 5 and the opening area of the black filter 8 positioned nearer to the peripheral area than the centers of gravity of the microlens 4 and opening area 3. Therefore, the optical axis of light converged by the microlens 4 becomes coincident with the centers of gravity of the light reception area of the photodiode 5 and opening area of the black filter layer 8.

If the light shielding layer 2 is disposed shifted as shown in FIG. 6B, a variation in light reception sensitivities can be reduced further.

Figure 8:
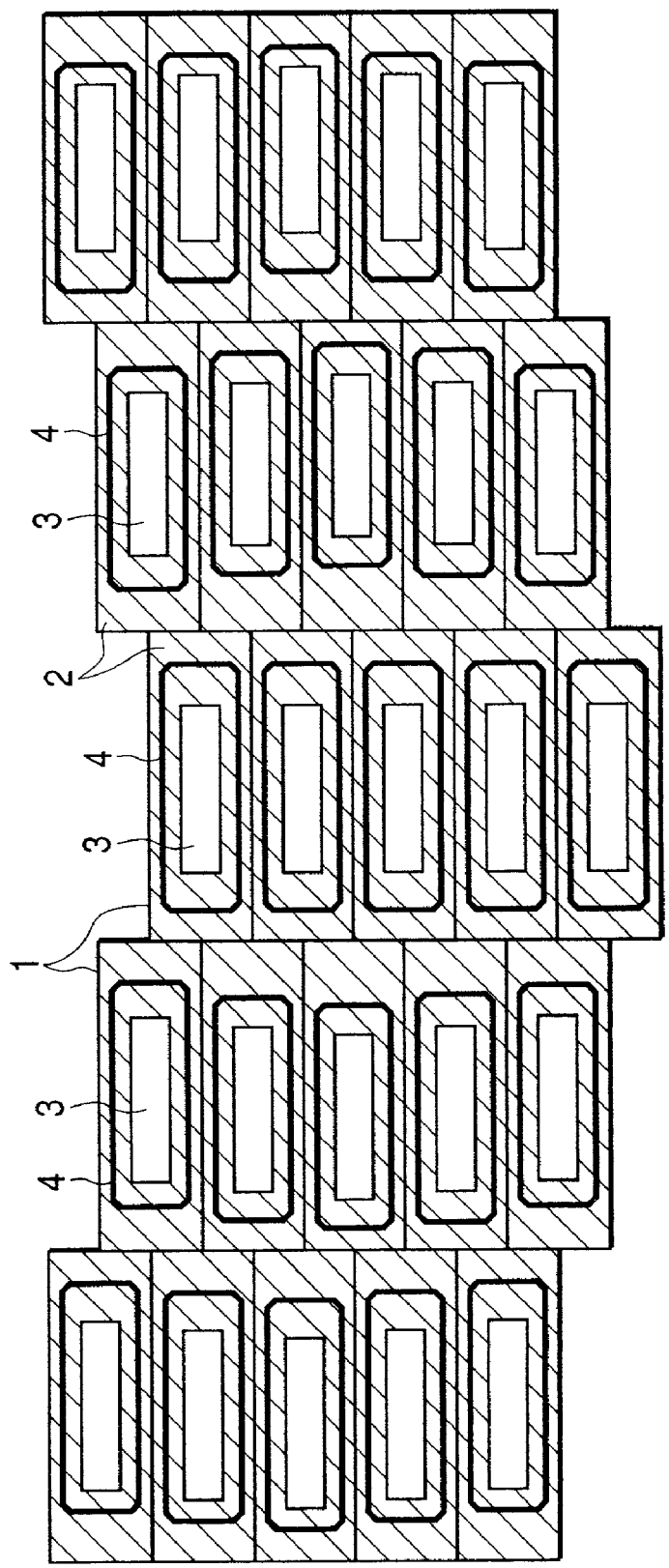
FIG. 8 is a plan view of pixels of a solid-state image pickup device according to a fourth embodiment of the invention.

FIG. 8 is a plan view of a pixel group of a solid-state image pickup device according to the fourth embodiment of the invention. As shown in FIG. 8, the solid-state image pickup device of this embodiment has rectangular pixels 1 disposed in a curved shape. By changing an aperture ratio of an opening area for photoelectric conversion in accordance with the position of each pixel, the solid-state image pickup device may be applied to an autofocussing solid-state image pickup device. Like elements to those shown in FIG. 4A are represented by using identical reference numerals.

As shown in FIG. 8, in this embodiment, the pixel 1 disposed nearer to the peripheral area than the center of the pixel group has the center of gravity of the light reception area of the photodiode 5 positioned nearer to the peripheral area than the centers of gravity of the microlens 4 and opening area 3. Therefore, the optical axis of light converged by the microlens 4 becomes coincident with the center of gravity of the light reception area of the photodiode 5.

Similar to the solid-state image pickup device shown in FIGS. 4A and 4B, the solid-state image pickup device shown in FIG. 8 can therefore reduce a variation in light reception sensitivities. If the light shielding layer 2 is disposed shifted as shown in FIG. 6B, a variation in light reception sensitivities can be reduced further. A black filter layer may be formed as shown in FIGS. 7A and 7B.

Figure 9:
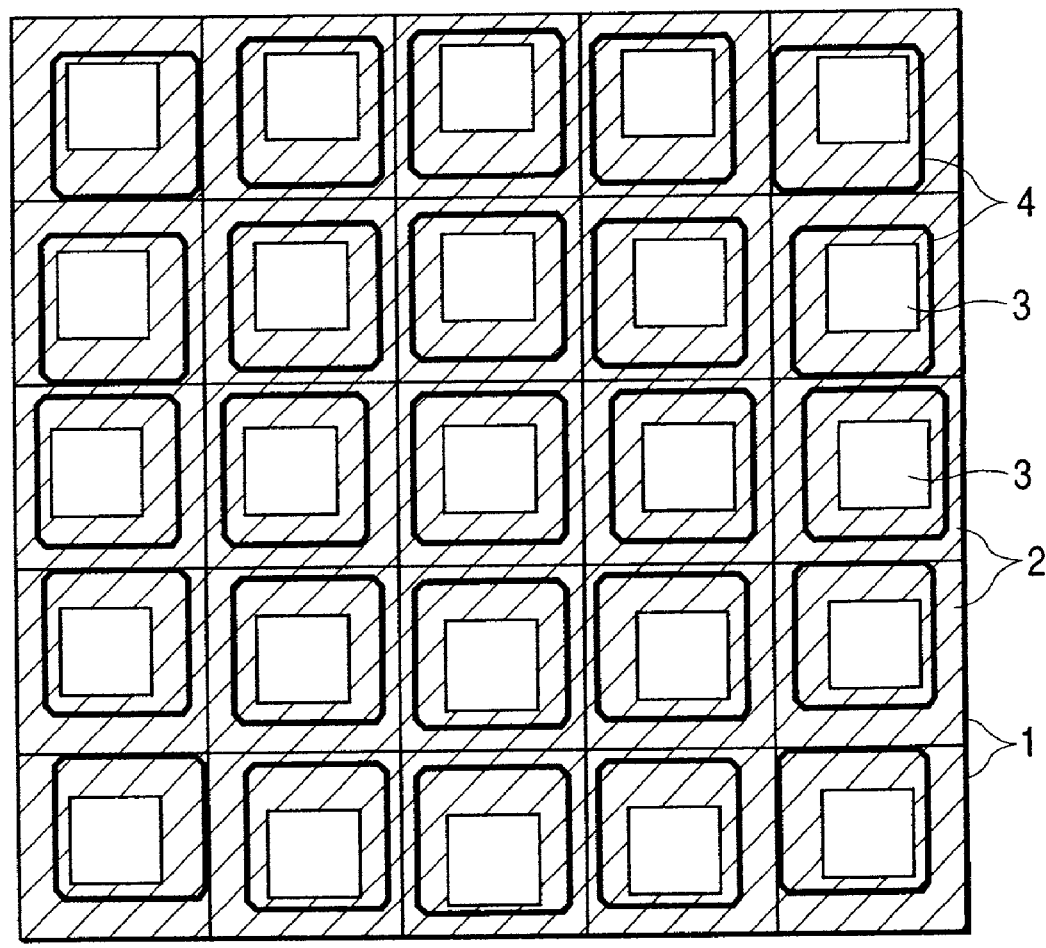
FIG. 9 is a plan view of pixels of a solid-state image pickup device according to a fifth embodiment of the invention.

FIG. 9 is a plan view showing a pixel group of a solid-state image pickup device according to the fifth embodiment of the invention. The layout of the pixel group shown in FIG. 9 is used if an unrepresented image pickup lens has a so-called barrel shape aberration. Namely, light passed through an image pickup lens with a barrel shape aberration is converged and distorted by the microlens 4. The solid-state image pickup device of this embodiment can correct such aberration generated in the optical system.

In FIG. 9, like elements to those shown in FIG. 4A are represented by using identical reference numerals. Also in this embodiment, similar to the embodiment shown in FIGS. 4A and 4B, the optical axis of light converged by the microlens 4 becomes coincident with the center of gravity of the light reception area of the photodiode 5.

If the light shielding layer 2 is disposed shifted as shown in FIG. 6B, a variation in light reception sensitivities can be reduced further. A black filter layer may be formed as shown in FIGS. 7A and 7B.

Figure 10:
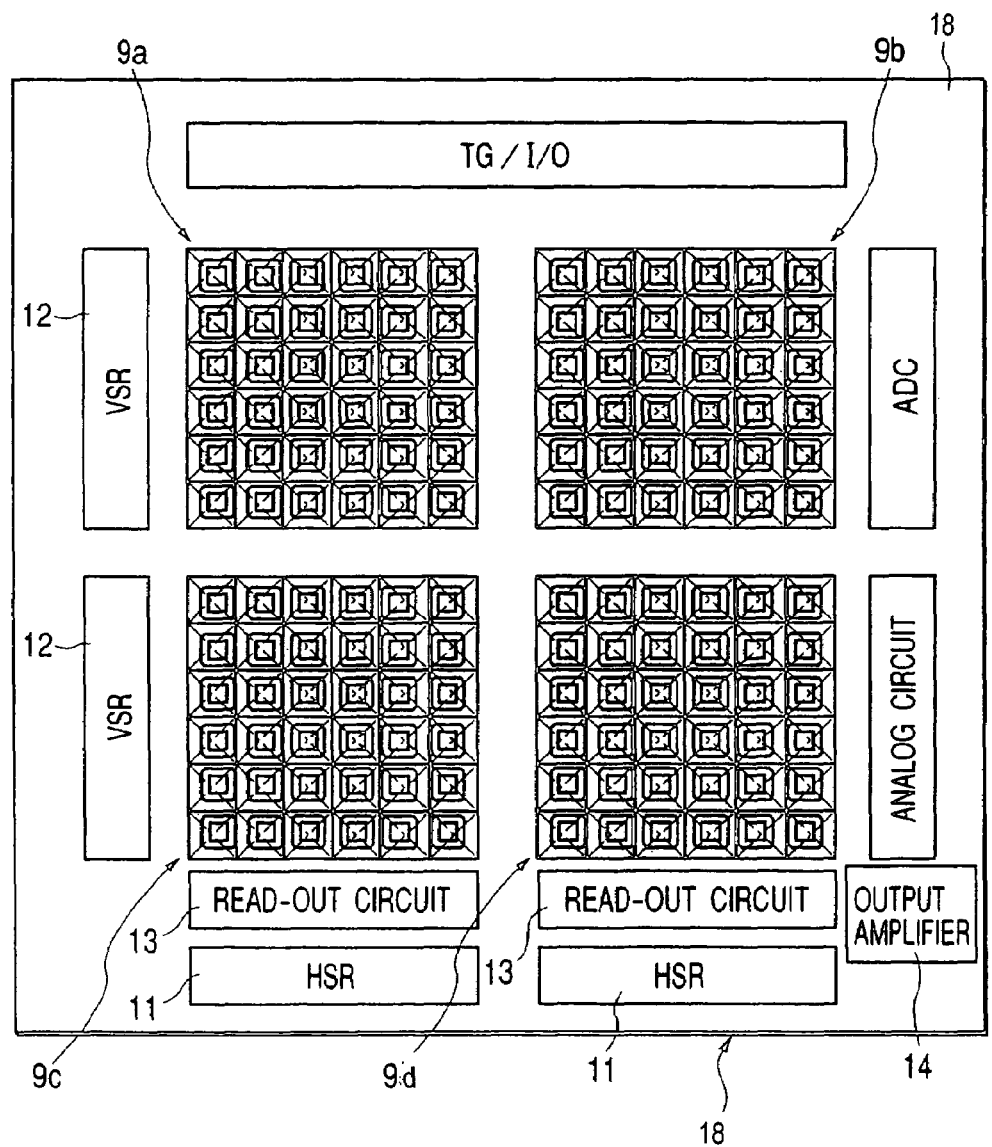
FIG. 10 is a diagram showing a plan layout of a solid-state image pickup device according to a sixth or seventh embodiment of the invention.
Figure 11:
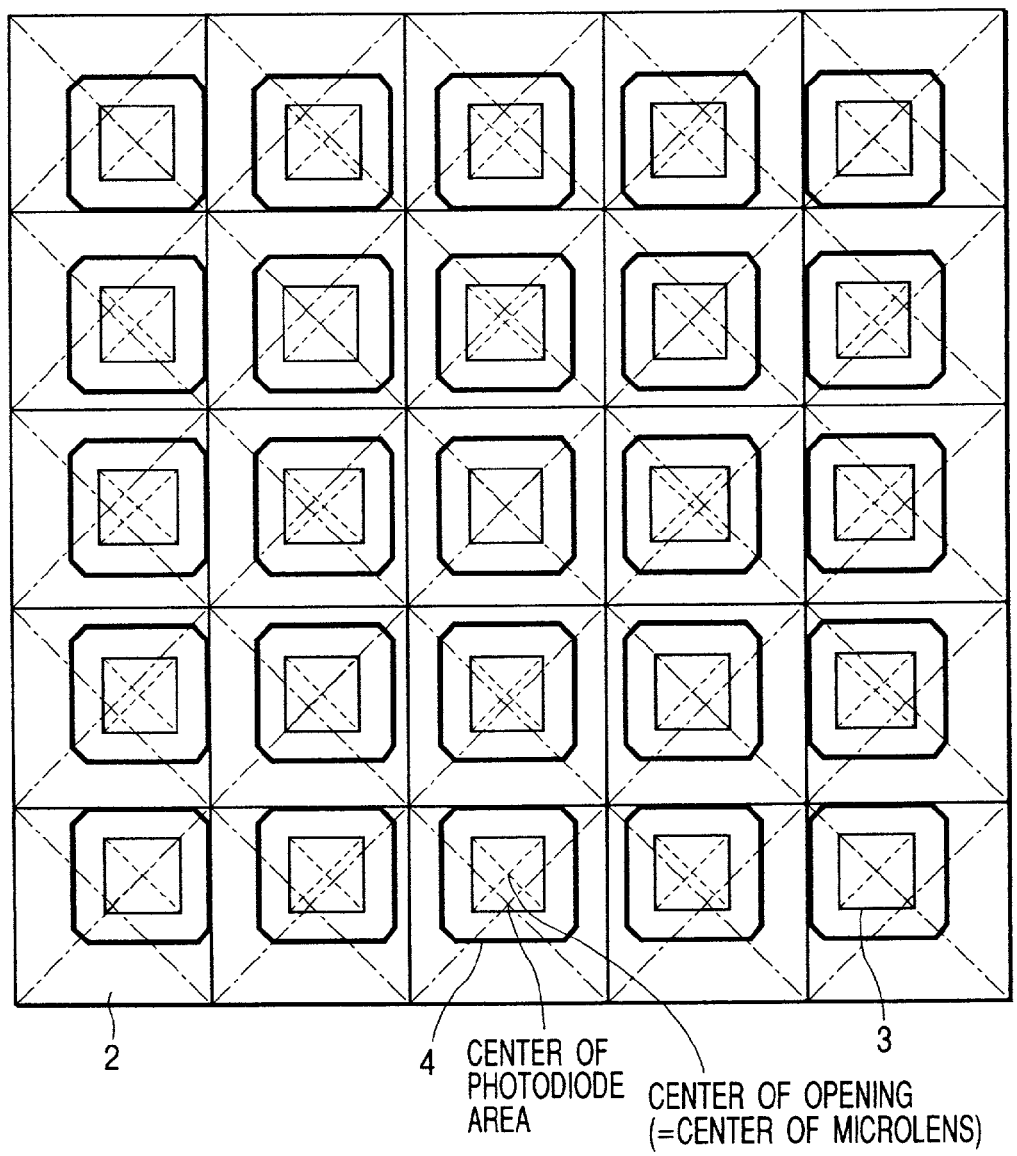
FIG. 11 is an enlarged view of one image pickup area according to the sixth embodiment of the invention.
Figure 12:
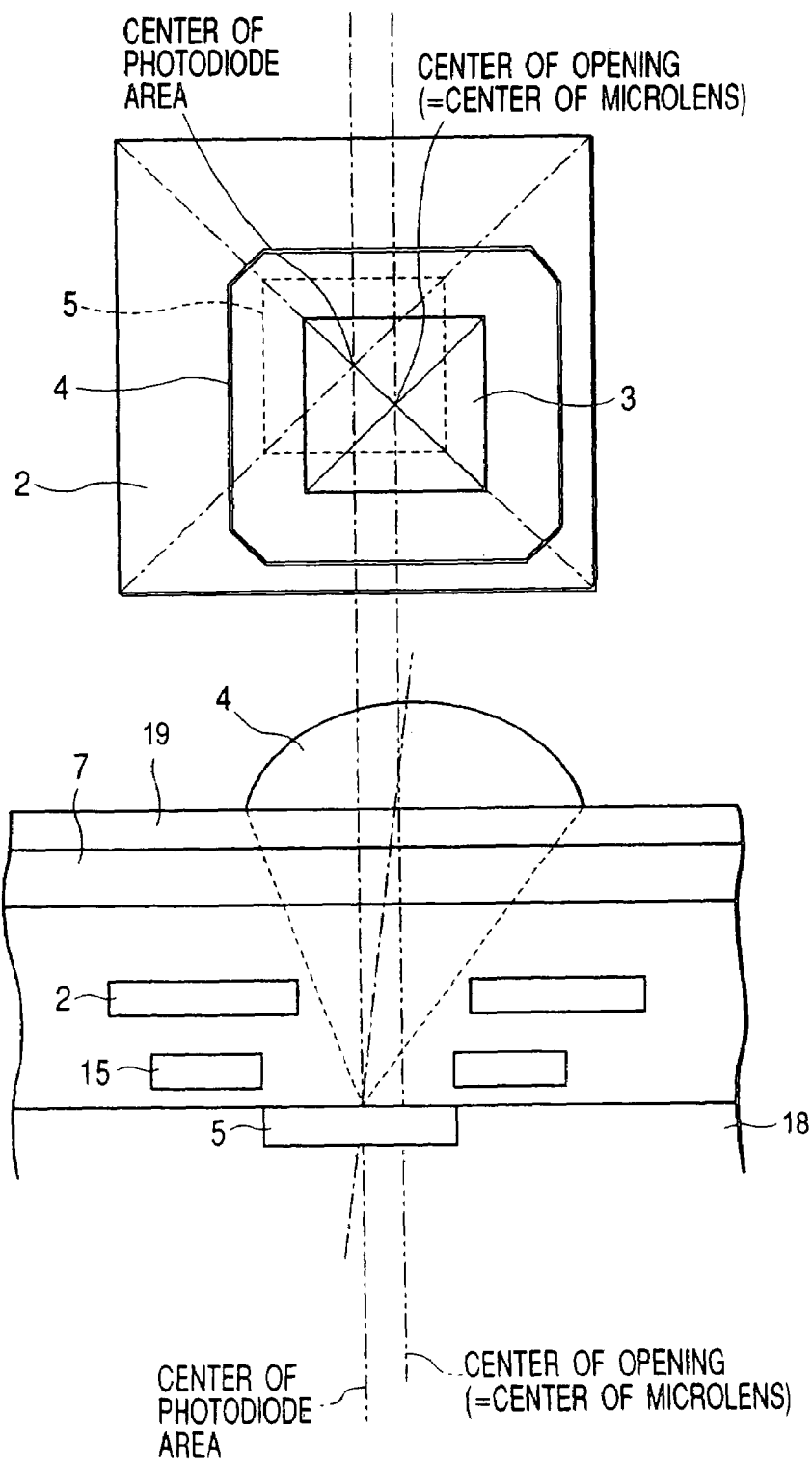
FIG. 12 is a plan view and a cross sectional view of a pixel according to the sixth embodiment of the invention.

FIG. 10 is a schematic diagram showing the plan layout of a solid-state image pickup device according to the sixth and seventh embodiments of the invention. FIG. 11 is a schematic diagram showing an enlarged layout of one of a plurality of pixel areas (image pickup areas) of the solid-state image pickup device. In practice, pixels are disposed in areas of several hundreds and several millions. For the purposes of simplicity, 5×5 pixel areas are shown. FIG. 12 is a plan view and a cross sectional view of one pixel with a microlens of the solid-state image pickup device.

In FIGS. 10 to 12, reference numeral 1 represents a pixel, reference numeral 2 represents a light shielding layer (light shielding area) for shielding an area excepting the photoelectric conversion area (photodiode area) of each pixel, and reference numeral 3 represents an opening area formed through the light shielding area and guiding light. Reference numeral 4 represents a microlens for converging light, reference numeral 18 represents a silicon (Si) substrate, reference numeral 7 represents a evened SiN passivation layer, and reference numeral 19 represents a microlens planarizing layer made of organic material. Reference symbol 9a represents an R pixel area, reference symbol 9b represents a G pixel area, reference symbol 9c represents a G pixel area, reference symbol 9d represents a B pixel area, and reference numeral 15 represents a wiring layer. In FIG. 10, reference numerals 11 denote a horizontal shift registers, reference numerals 12 denote a vertical shift registers, reference numerals 13 denote a read-out circuits and reference numeral 14 denotes an output amplifier.

In this embodiment, the solid-state image pickup device is used for a four-eye type compound eye solid-state image pickup device. Two G pixel areas 9b and 9c are used for improving a resolution. If a high resolution is not necessary, one G pixel area is used to form a so-called three-eye compound eye solid-state image pickup device.

Figure 13:
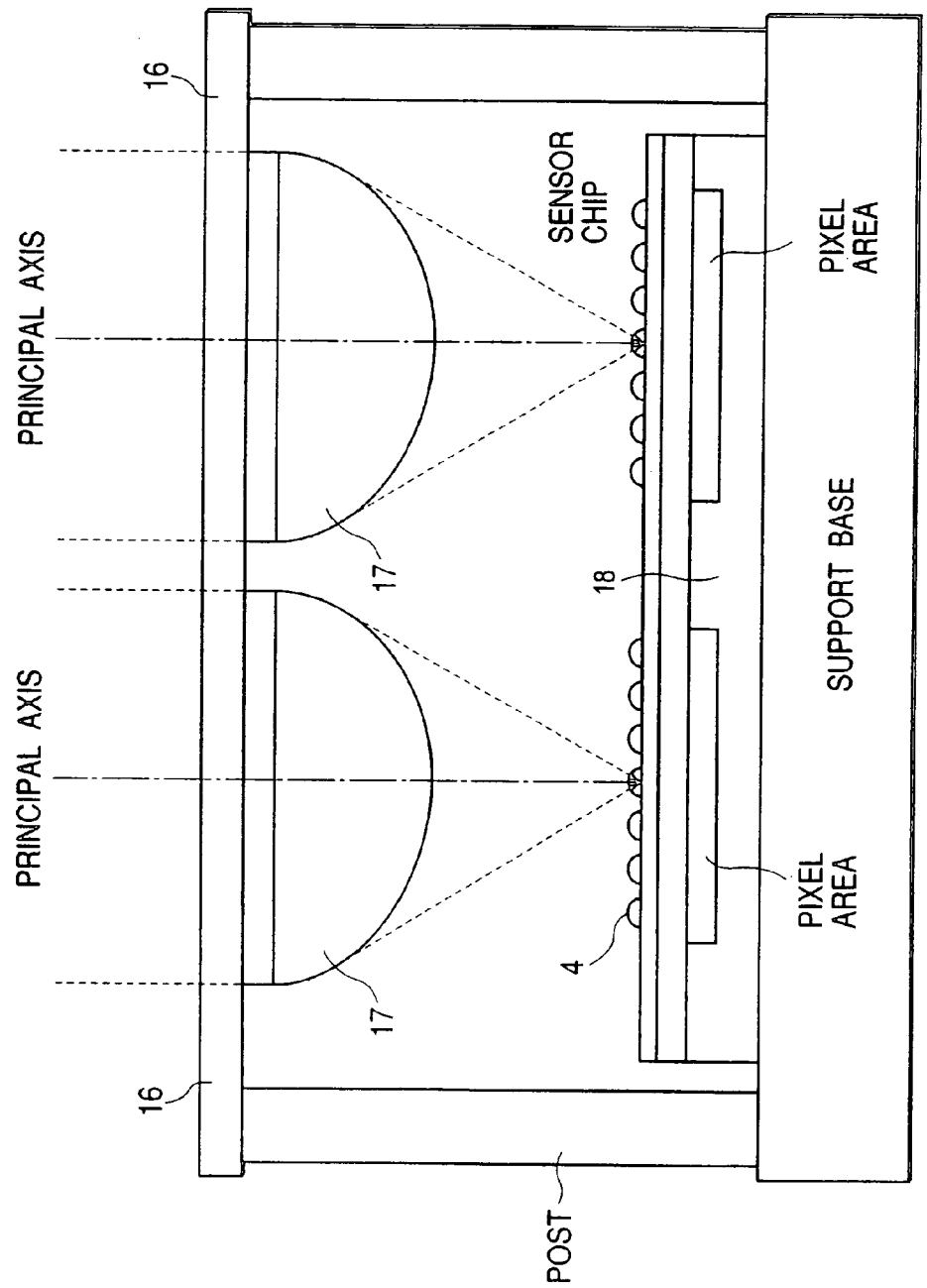
FIG. 13 is a cross sectional view of a compound eye type solid-state image pickup apparatus using a solid-state image pickup device of the sixth embodiment of the invention.

FIG. 13 is a schematic diagram showing a compound eye image pickup apparatus including an image pickup lens optical system. Color filters 16 and image pickup lenses 17 are formed at positions corresponding to pixel areas of the solid-state image pickup device.

In pixel areas, the centers of an opening 3 of the light shielding layer 2 and the micro lens 4 are shifted in each pixel from the center of the photoelectric conversion area of the pixel. This shift amount is set larger at the position nearer to the peripheral area of a micro chip. The shift amount is determined by an image pickup lens 17. The layout of the substrate is determined so that the center of an optical axis between the image pickup lens 17 and micro lens 4 becomes generally coincident with the center of the photoelectric conversion area. The layout of the light shielding layer 2 is determined so as not to intercept light converged by the microlens 4.

Figure 14:
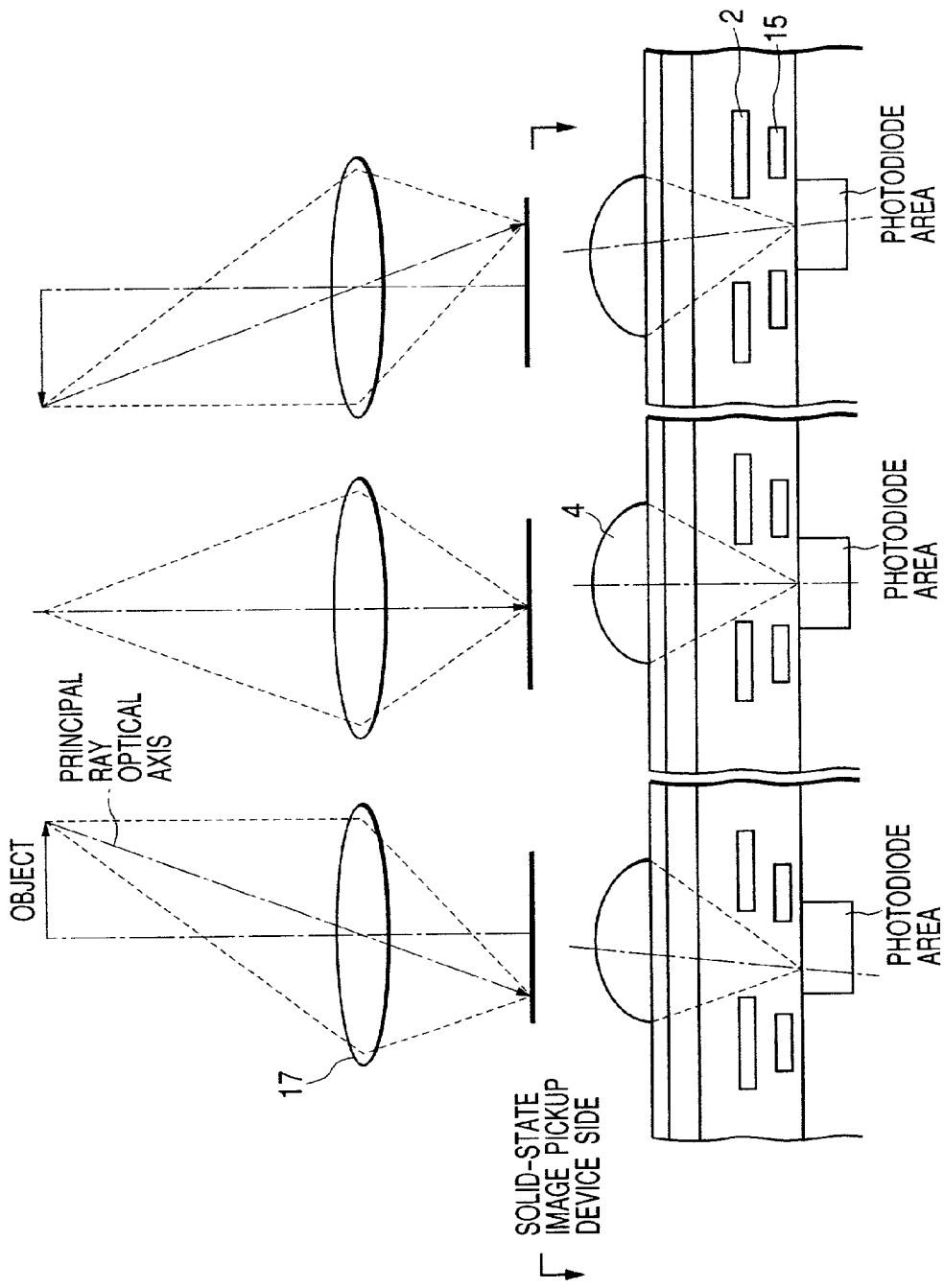
FIG. 14 is a diagram explaining the effects of the sixth embodiment of the invention.
Figure 15:
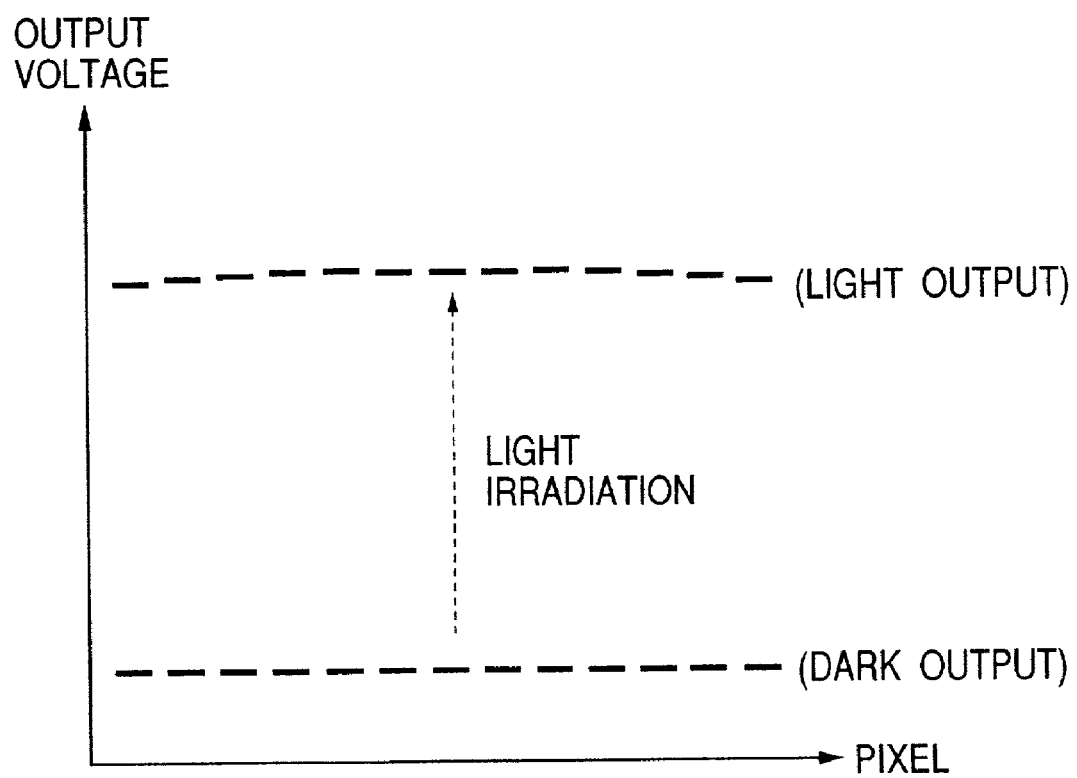
FIG. 15 is a graph showing outputs of a solid-state image pickup device of the sixth embodiment of the invention.

FIGS. 14 and 15 illustrate the operation and effects of this embodiment. As shown in FIG. 14, the microlens 4 is disposed so that the principal optical axis of the image pickup lens 17 becomes coincident with the center of the photoelectric conversion area, and the light shielding layer 2 is disposed so that light fluxes converged by the microlens 4 are not intercepted. In this manner, good characteristics with less optical shading can be obtained as shown in FIG. 15.

Four pixel areas may use the same layout in order to reduce a design load. However, it is practically more preferable to use the layout taking a refractive index of each color into consideration, i.e., the layout with a shift amount changed with each pixel.

In this embodiment, the surface passivation layer 7 is evened by chemical mechanical polishing (CMP). Therefore, the evening layer can be thinned to 0.2 $\mu$m or thinner although a conventional evening layer is about 2 $\mu$m. It is therefore possible to set a distance between the photoelectric conversion area (photodiode area) and microlens 4, to 2 to 3 $\mu$m, although a conventional element requires a distance of 4 to 5 $\mu$m.

Figure 16:
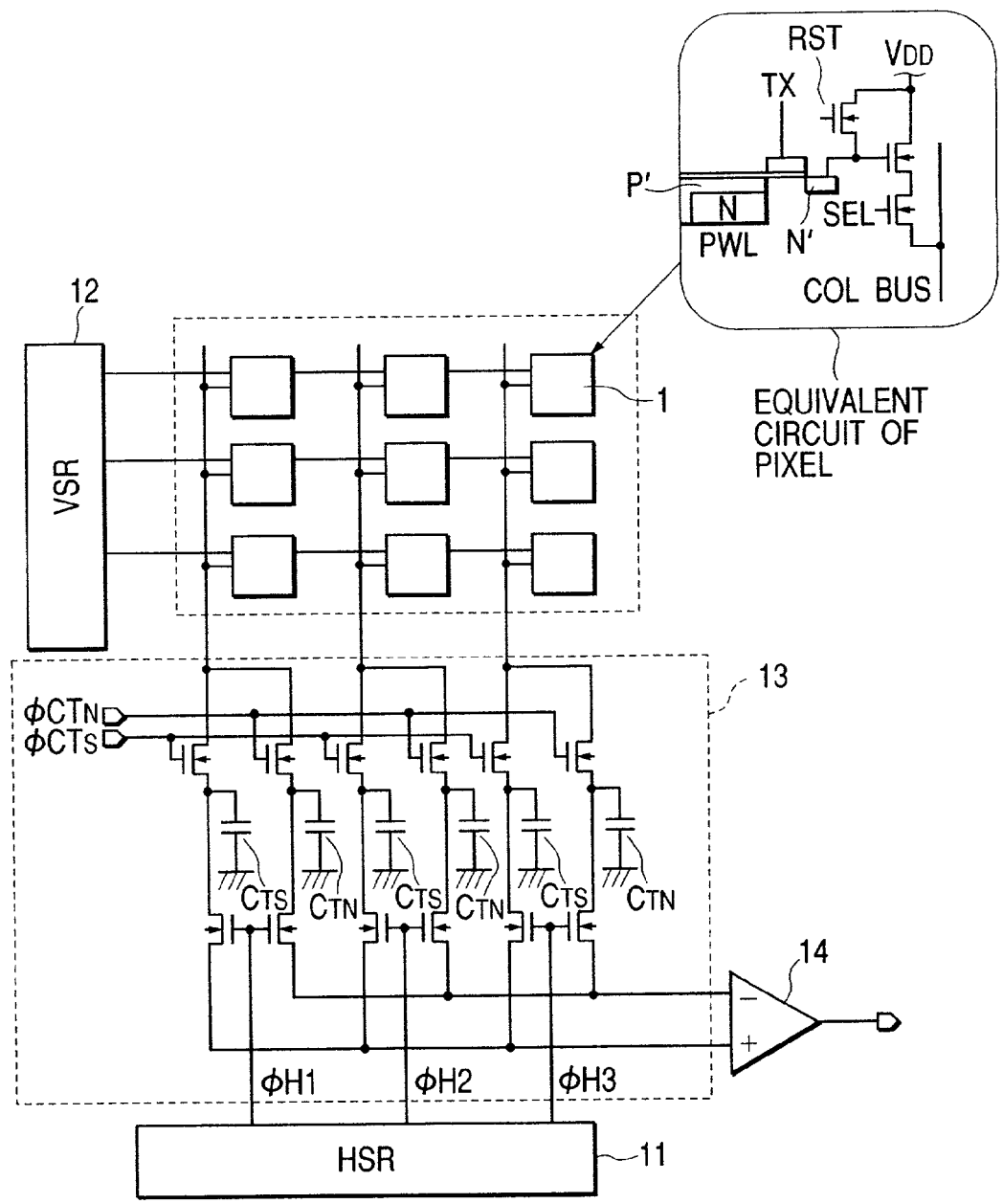
FIG. 16 is an equivalent circuit diagram of one image pickup area of the sixth embodiment of the invention.

FIG. 16 is an equivalent circuit diagram of one pixel area of the solid-state image pickup device of this embodiment. In FIG. 16, reference numeral 11 represents a horizontal shift register, reference numeral 12 represents a vertical shift register, reference numeral 13 represents a read-out circuit, and reference numeral 14 represents an output amplifier.

Generally, a CMP process is in many cases a standard process of CMOS processes. If the embodiment is applied to a CMOS sensor, standard processes are not required to be changed greatly. Therefore, the development time can be shortened considerably and the development cost can be reduced greatly.

This embodiment can obtain output signals of a high sensitivity and with less shading. A thin image pickup apparatus can be realized. The invention is applicable not only to a CMOS sensor but also to a solid image pickup apparatus with microlenses such as CCD, BASIS, SIT, CMD and AMI.

Figure 17:
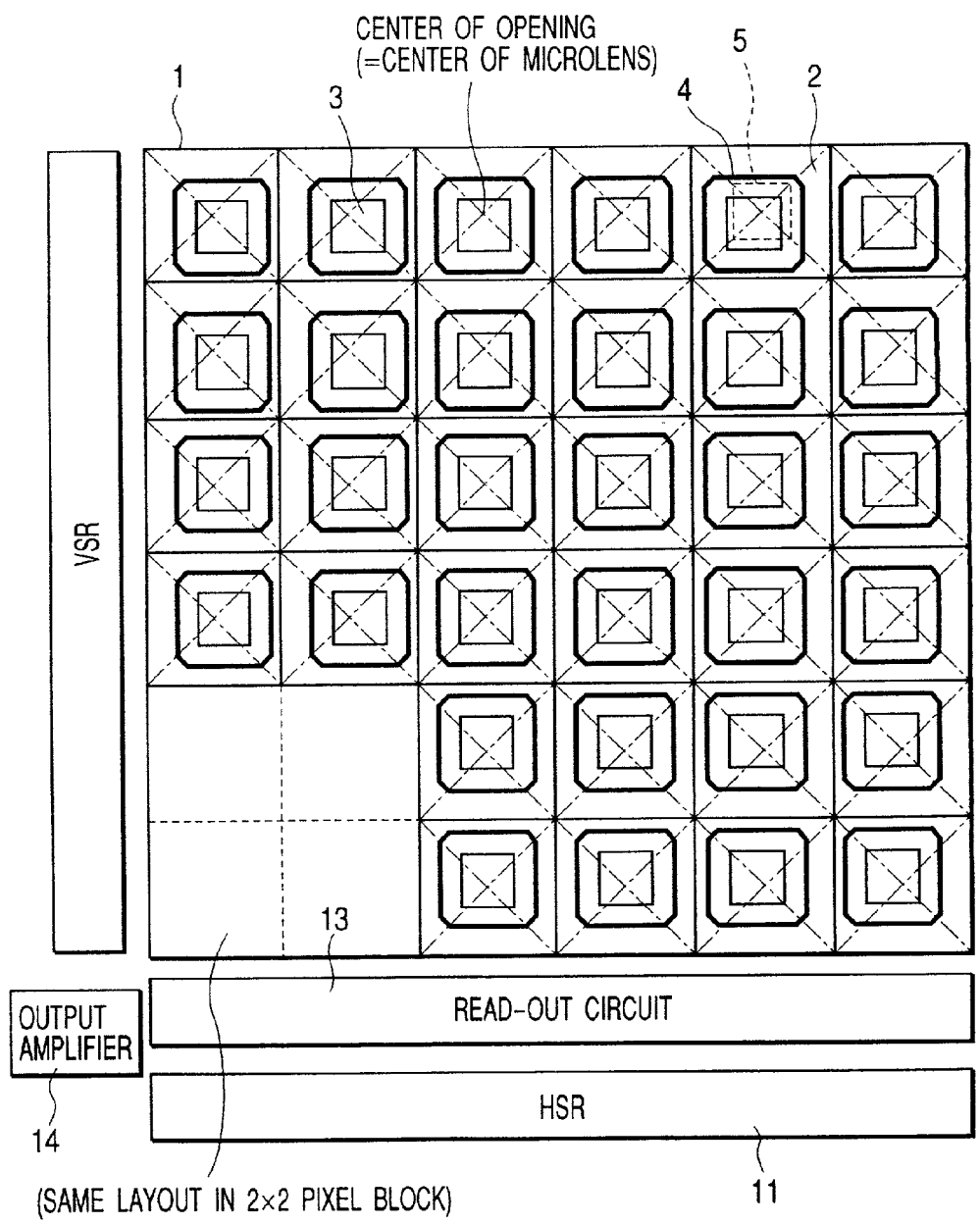
FIG. 17 is an enlarged view of one image pickup area of the sixth embodiment of the invention.

FIG. 17 shows the plan layout of one of a plurality of pixel areas according to the seventh embodiment of the invention. In the sixth embodiment, the centers of the microlens and the opening area of the light shielding layer 2 are shifted in each pixel. In the seventh embodiment, a plurality of pixels are divided into groups and the centers of the microlens and the opening area of the light shielding layer 2 are shifted relative to the center of the layout of each group. In FIG. 17, the layout has groups each being constituted of 2×2 pixels. The pitch between a plurality of microlenses in one group is different from the pitch between a plurality of microlenses in another group.

As compared to the sixth embodiment, the seventh embodiment provides a layout of a plurality of pixels so that the work load of the layout can be reduced. If the number of pixels of each group is increased, the layout load is reduced. However, the number of pixels having their optical axis center shifted from the photodiode center increases so that shading becomes slightly large. It is therefore desired to divide pixels into groups to the extent that optical shading is in an allowable range. For example, if pixels are grouped to the extent that a shift of an optical axis becomes 0.1 $\mu$m or shorter, optical shading is substantially negligible. The layout load can therefore be reduced. Namely, the design cost can be suppressed and a solid-state image pickup device of a high sensitivity and with less optical shading can be realized.

Figure 18:
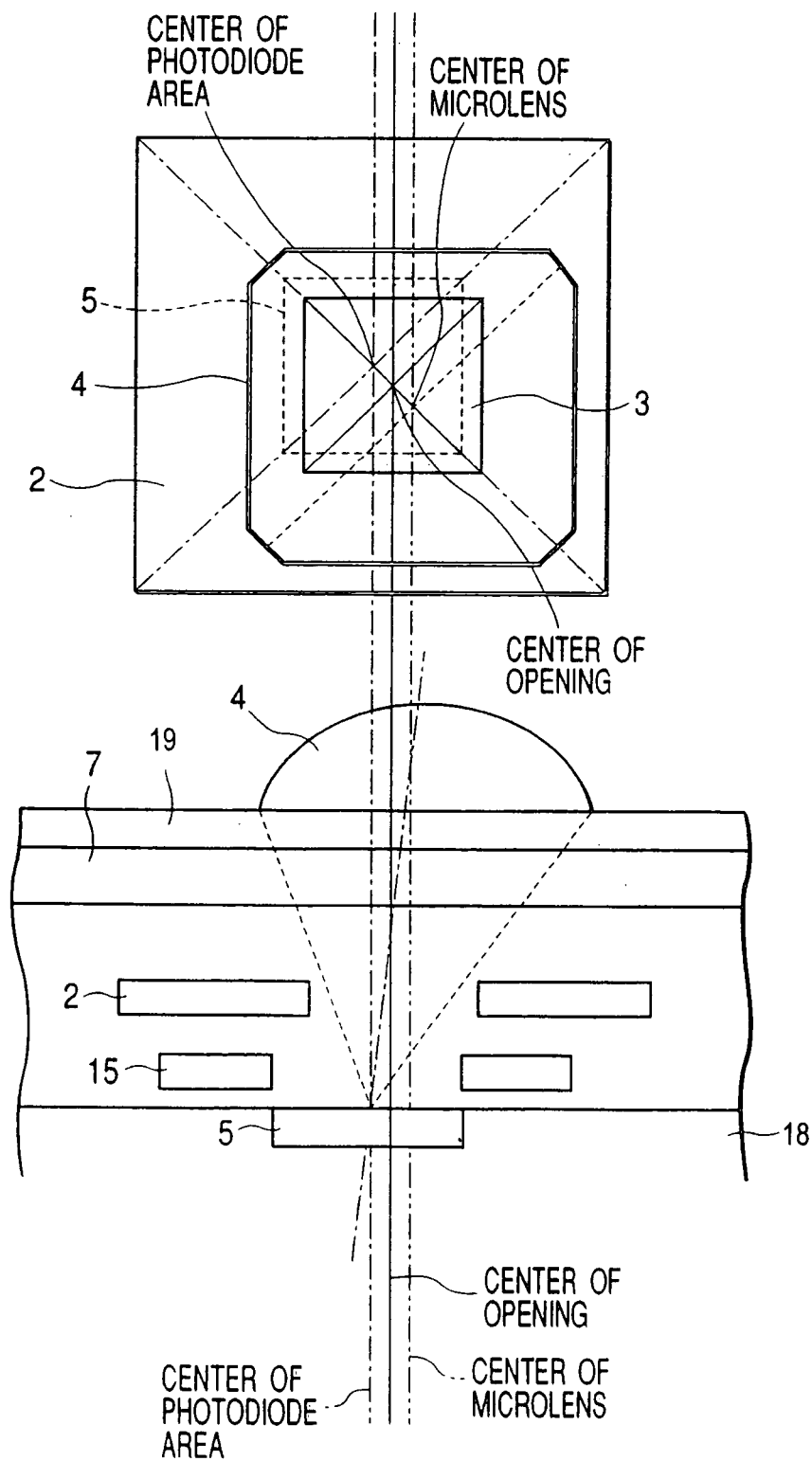
FIG. 18 is a plan view and a cross sectional view of a pixel according to another embodiment of the invention.

In the sixth and seventh embodiments, the center of the micro lens is made coincident with the center of the opening area. As shown in FIG. 18, the microlens and the opening area may be shifted toward the center of the image pickup area relative to the photoelectric conversion area and the microlens may be shifted toward the center of the image pickup area relative to the opening area.

In this case, as compared to the sixth and seventh embodiments, although it is more difficult to adjust the positions of the microlens, opening area and photoelectric conversion area, an improved light convergence factor in the photoelectric conversion area is obtained in the peripheral area.

If the solid-state image pickup device described in the sixth or seventh embodiment is used with an image pickup apparatus such as a digital camera, a thin image pickup apparatus can be realized.

The solid-state image pickup devices described in the first to seventh embodiments include various types of elements such as a CMOS sensor, CCD, BASIS, SIT, CMD and AMI.

Pixels are not limited only to two-dimensional pixels but pixels disposed one-dimensionally may also be used.

An image pickup apparatus according to the eighth embodiment will be described with reference to FIG. 19, this image pickup apparatus using one of the solid-state image pickup devices of the first to seventh embodiments.

Figure 19:
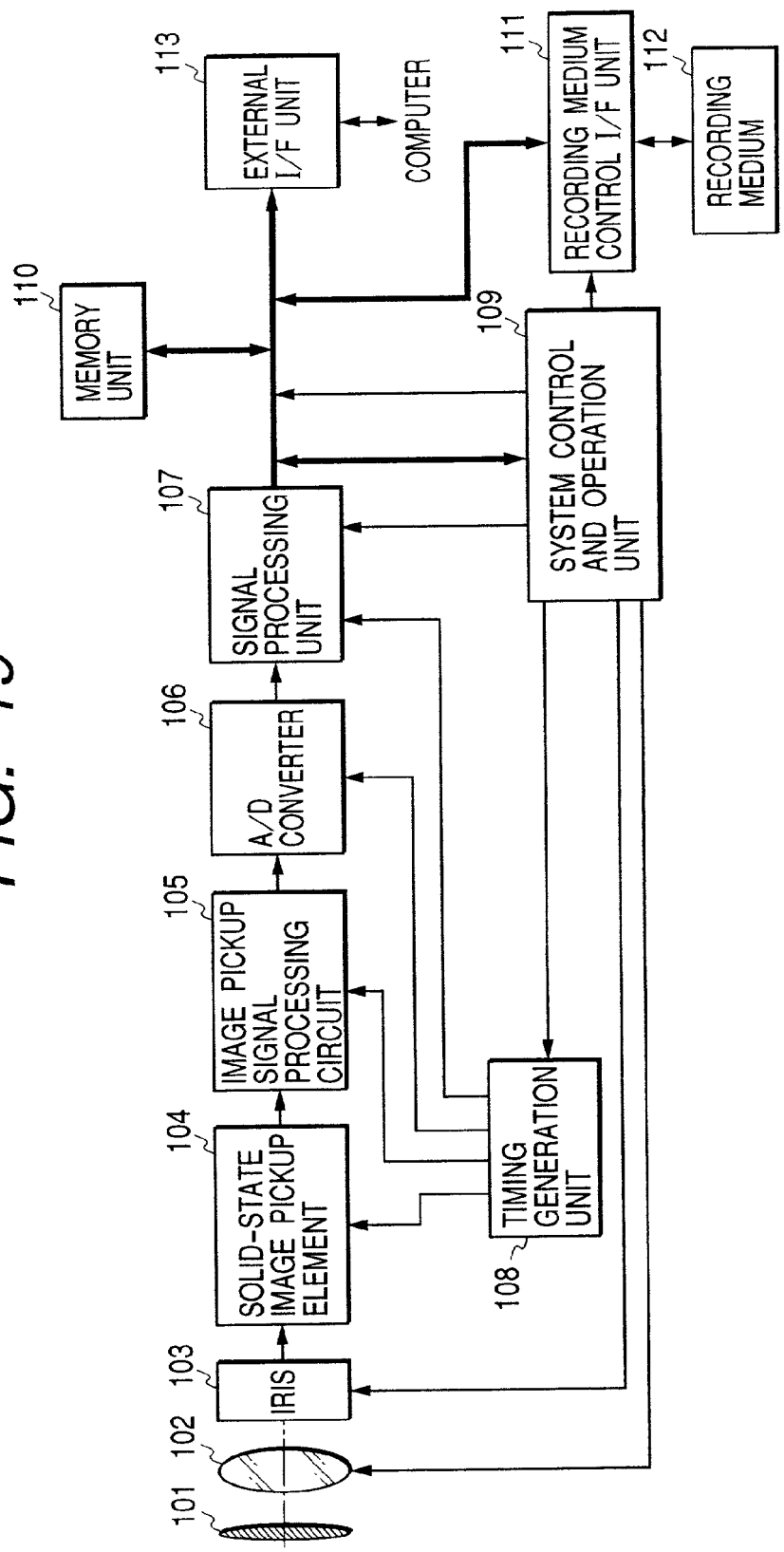
FIG. 19 is a diagram showing an image pickup apparatus.

In FIG. 19, reference numeral 101 represents a barrier serving as a protector for a lens 102 and as a main switch. The lens 102 focusses an optical image of an object upon a solid-state image pickup device 104. Reference numeral 103 represents an iris for changing the amount of light passed through the lens 102. The solid-state image pickup device 104 may be any element of the first to seventh embodiments and picks up the object image focussed by the lens 102 in the form of image signals. Reference numeral 105 represents an image pickup processing circuit having a variable gain amplifier for amplifying the image signal output from the solid-state image pickup device 104, a gain correction circuit for correcting a gain value, and other circuits. Reference numeral 106 represents an A/D converter for converting the analog image signal output from the solid-state image pickup device 104 into a digital image signal. Reference numeral 107 represents a signal processing unit for performing various corrections such as color processing for the image data output from the A/D converter 106 and for performing data compression. Reference numeral 108 represents a timing generation unit for outputting various timing signals to the solid-state image pickup device 104, image pickup processing circuit 105, A/D converter 106 and signal processing unit 107. Reference numeral 109 represents a system control and operation unit for performing various calculations and controlling the entirety of a still video camera. Reference numeral 110 represents a memory unit for temporarily storing image data. Reference numeral 111 represents an interface unit used for read/write of a recording medium 112. The recording medium 112 is a removable medium such as a semiconductor memory for reading/writing image data. Reference numeral 113 represents an interface unit for communication with an external computer or the like.

Next, an image pickup operation of the still video camera constructed as above will be described.

As the barrier 101 is opened, a main power is turned on, then a control system power is turned on, and then a power for an image pickup system such as the A/D converter 106 is turned on. In order to adjust the exposure amount, the system control and operation unit 109 opens the iris 103 fully and a signal output from the solid-state image pickup device 104 is converted by the A/D converter and input to the signal processing unit 107.

In accordance with the data supplied from the signal processing unit, the system control and operation unit 109 calculates an exposure amount.

In accordance with this photometry, a brightness of an object is judged and the system control and operation unit 109 controls the iris 109 in accordance with the judged brightness.

Next, the high frequency components of the signal output from the solid-state image pickup device 104 are removed, and the system control and operation unit 109 calculates a distance to the object. Thereafter, the lens is driven and an in-focus state is checked. If not in the in-focus state, the lens is again driven to perform range finding.

After the in-focus state is confirmed, a main exposure starts.

After this exposure, the image signal output from the solid-state image pickup device 104 is converted into a digital image signal by the A/D converter 106. The digital image signal is processed by the signal processing unit 107 and written in the memory unit by the system control and operation unit 109.

Under the control of the system control and operation unit 109, the data stored in the memory unit 110 is supplied to the recording medium control I/F unit and stored in the removable recording medium 112 such as a semiconductor memory.

The image data may be input directly to a computer or the like via the external I/F unit 113 to process image data.

As described so far, with the solid-image pickup element of any of the first to seventh embodiments, pixels can be made extremely fine and optical shading to be caused by convergence irregularity of microlenses for a number of pixels can be reduced considerably. The quality of an image reproduced by an image pickup apparatus using the solid-state image pickup device, such as a video camera and a still video camera, can be improved.

By applying the solid-state image pickup device of the sixth or seventh embodiment to an image pickup apparatus, the device can be made compact, particularly thin. Therefore, a thin card size, for example, about 3 mm in thickness, can be realized.

Many widely different embodiments of the present invention may be constructed without departing from the spirit and scope of the present invention. It should be understood that the present invention is not limited to the specific embodiments described in the specification, except as defined in the appended claims.

What is claimed is:

1. A solid-state image pickup apparatus comprising:
    a plurality of image pickup areas each of which includes photoelectric conversion areas arranged two-dimensionally;
    image pickup lenses provided correspondingly to the plurality of image pickup areas respectively;
    microlenses for converging light, arranged between the image pickup lenses and the photoelectric conversion areas correspondingly to the photoelectric conversion areas respectively; and
    opening portions provided correspondingly to the photoelectric conversion areas respectively, through each of which the light is incident onto the corresponding photoelectric conversion area,
    wherein color filters of a same color are arranged in each of the plurality of image pickup areas so that the color filters of different three colors are arranged in the plurality of image pickup areas respectively,
    wherein in a peripheral area of each of the plurality of image pickup areas, positions of the microlenses and the opening portions are shifted toward the center of each image pickup area more than the corresponding photoelectric conversion areas, and
    wherein shift amounts of microlenses with respect to the corresponding photoelectric conversions areas differs between at least two of the plurality of image pickup areas wherein the color filters of the different colors are arranged respectively.

2. A camera comprising:
    a solid-state image pickup apparatus defined in claim 1;
    a lens for focusing light onto the solid-state image pickup apparatus; and
    a signal processing portion which processes a signal from the solid-state image pickup apparatus.

* * * * *

UNITED STATES PATENT AND TRADEMARK OFFICE
CERTIFICATE OF CORRECTION

PATENT NO. : 6,995,800 B2  
APPLICATION NO. : 09/768500  
DATED : February 7, 2006  
INVENTOR(S) : Hidekazu Takahashi It is certified that error appears in the above-identified patent and that said Letters Patent is hereby corrected as shown below:

ON COVER PAGE AT (57) ABSTRACT

Line 10, "than" should read --more than--.

COLUMN 2

Line 41, "than" should read --more than--; and  
   Line 64, "than" should read --more than--.

COLUMN 3

Line 25, "than" should read --more than--.

COLUMN 7

Line 3, "a" should be deleted;  
   Line 4, "a" should be deleted; and  
   Line 5, "a" should be deleted.

COLUMN 10

Line 47, "differs" should read --differ--.

Signed and Sealed this

Twenty-second Day of August, 2006

JON W. DUDAS  
*Director of the United States Patent and Trademark Office*